(12) United States Patent
Sorace et al.

(10) Patent No.: US 7,633,339 B2
(45) Date of Patent: Dec. 15, 2009

(54) DIFFERENTIAL AMPLIFIER

(75) Inventors: Christian V. Sorace, Nice (FR); Xavier Albinet, Saint-Laurent du Var (FR); Pierre Carbou, Tourrettes sur Loup (FR)

(73) Assignee: Texas Instruments Incorporated, Dallas, TX (US)

( * ) Notice: Subject to any disclaimer, the term of this patent is extended or adjusted under 35 U.S.C. 154(b) by 50 days.

(21) Appl. No.: 11/947,065

(22) Filed: Nov. 29, 2007

(65) Prior Publication Data

US 2009/0085659 A1 Apr. 2, 2009

(30) Foreign Application Priority Data

Sep. 27, 2007  (EP) .................. 07291164
Sep. 28, 2007  (EP) .................. 07291180

(51) Int. Cl.
*H03F 3/217* (2006.01)
(52) U.S. Cl. .................. 330/207 A
(58) Field of Classification Search .......... 330/10, 330/207 A, 251
See application file for complete search history.

(56) References Cited

U.S. PATENT DOCUMENTS 7,339,425 B2 * 3/2008 Yang .............. 330/10

\* cited by examiner

*Primary Examiner*—Steven J Mottola
(74) *Attorney, Agent, or Firm*—Wade J. Brady, III; Frederick J. Telecky, Jr.

(57) ABSTRACT

An amplifier comprising an analog amplifier which outputs a first current and a second current. The amplifier also comprises a first digital amplifier coupled to the analog amplifier, the first digital amplifier amplifies a modified version of the first current to produce a third current. The amplifier also comprises a second digital amplifier coupled to the analog amplifier, the second digital amplifier amplifies a modified version of the second current to produce a fourth current. The amplifier also includes connections configured to provide the first, second, third and fourth currents through a load.

23 Claims, 4 Drawing Sheets

DIFFERENTIAL AMPLIFIER

CROSS-REFERENCE TO RELATED APPLICATION

The present application claims priority to EP Application No. 07291164.7, filed on Sep. 27, 2007, and EP Application No. 07291180.3, filed on Sep. 28, 2007, both of which are hereby incorporated herein by reference.

BACKGROUND

Various types of amplifiers are used in a variety of applications such as audio applications. For example, as mobile phone technology progresses, increasingly sophisticated, efficient amplifiers that produce high-fidelity sound are incorporated into mobile phones. Some types of amplifiers provide high-fidelity sound, but they use power inefficiently. Other types of amplifiers use power efficiently, but produce poor sound quality. Combinations of these types of amplifiers produce high-fidelity sound and use power efficiently, but they are difficult to design. Thus, improvements in amplifier technology are desirable.

SUMMARY

Accordingly, there is disclosed herein a differential amplifier architecture which produces high-fidelity sound, conserves power and is easier to customize for specific applications. Illustrative embodiments comprise an analog amplifier which outputs a first current and a second current. The amplifier also comprises a first digital amplifier coupled to the analog amplifier, the first digital amplifier amplifies a modified version of the first current to produce a third current. The amplifier also comprises a second digital amplifier coupled to the analog amplifier, the second digital amplifier amplifies a modified version of the second current to produce a fourth current. The amplifier also includes connections configured to provide the first, second, third and fourth currents through a load.

Another illustrative embodiment includes a device comprising an analog amplifier that produces a first signal. The device includes a current mirror, coupled to the analog amplifier, which produces a second signal using the first signal, the second signal proportional to the first signal by a factor. The device also comprises a digital amplifier, coupled to the current mirror, which amplifies the second signal to produce a third signal. The device further comprises a load through which the first and third signals pass. A switching frequency of the device depends upon a frequency of a clock signal used by the digital amplifier to produce the third signal.

Yet another illustrative embodiment includes a method that comprises using a differential amplifier to generate first and second signals, generating a third signal proportional to the first signal by a factor, generating a fourth signal proportional to the second signal by another factor, using multiple digital amplifiers to amplify the third and fourth signals, and providing the first signal, the second signal, the amplified third signal and the amplified fourth signal to a load.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. The term "connection" refers to any path via which a signal may pass. For example, the term "connection" includes, without limitation, wires, traces and other types of electrical conductors, optical devices, etc.

As used herein, the term "class AD amplifier" refers to a class of amplifier which has both an analog and a digital amplifier. The output of the digital amplifier depends on the output of the analog amplifier. The outputs of the analog and digital amplifiers are combined and then passed through a load.

Further, as used herein, the term "fully differential amplifier" refers to an amplifier having both differential input and differential output terminals. Also, the term "current mirror" refers to a current sensing apparatus which, unlike traditional class AD amplifiers, does not contain a sense resistor.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
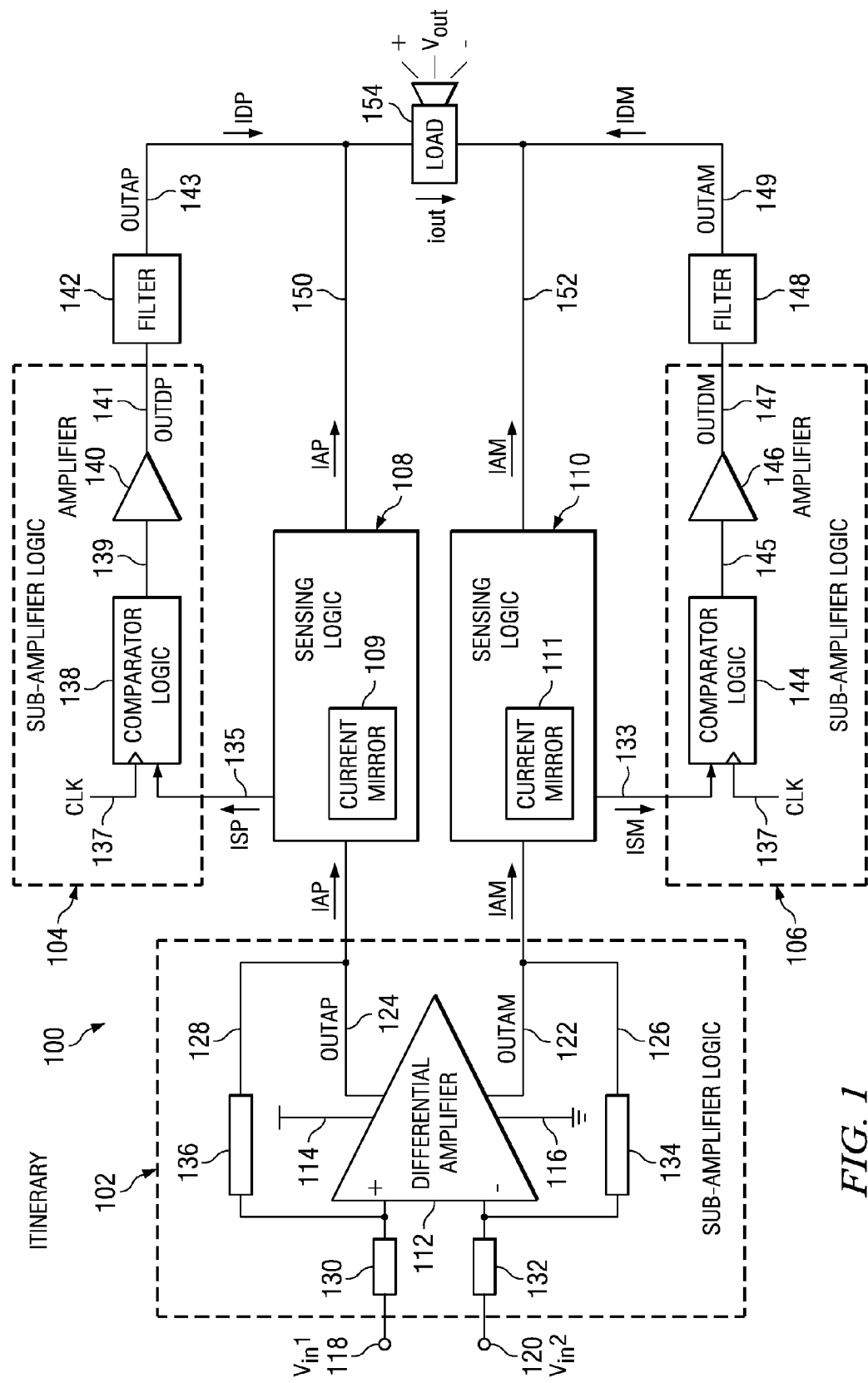
FIG. 1 shows a block diagram of an amplifier, in accordance with preferred embodiments of the invention.

Described herein is an amplifier architecture which provides high-fidelity sound amplification while consuming power efficiently. The architecture can be used in applications other than amplifying sound, as desired. FIG. 1 shows an illustrative architecture of the amplifier 100. The architecture of the amplifier 100 is described first, followed by a description of the operation of the amplifier 100. The amplifier 100 comprises a sub-amplifier logic (SAL) 102, a SAL 104 and a SAL 106. The SAL 102 preferably comprises an analog amplifier and the SALs 104 and 106 preferably comprise digital amplifiers which have outputs that are dependent on the analog amplifier's output. For this reason, the amplifier 100 in the disclosed embodiments may be classified as a class "AD" amplifier. As described below, in preferred embodiments, the SALs 104 and 106 are similar, if not identical, in structure. For this reason, the amplifier 100 is said to be a class AD amplifier having a differential architecture. The SAL 102 couples to the SAL 104 by way of connection 124, a sensing logic 108 and a connection 135. Similarly, the SAL 102 couples to the SAL 106 by way of a connection 122, a sensing logic 110 and a connection 133.

The SAL 104 couples to a signal filter (e.g., a low-pass filter) 142 via a connection 141, and the SAL 106 couples to a signal filter (e.g., a low-pass filter) 148 via a connection 147. Each of the filters 142 and 148, as well as the sensing logic 108 and the sensing logic 110, couples to a load (e.g., an audio speaker) 154 via connections 143, 149, 150 and 152, respectively. There is now provided a more specific description of the architectures of the SALs 102, 104 and 106, along with a description of the operation of each. There is subsequently provided an description of the overall operation of the amplifier 100.

The SAL 102 preferably comprises an analog, differential amplifier 112, although any suitable type of amplifier may be used. The differential amplifier 112 comprises both a positive (+) input terminal and a negative (−) input terminal. The positive input terminal couples to an input connection 118 and the negative input terminal couples to an input connection 120. The differential amplifier 112 receives two input signals $V_{in}1$ and $V_{in}2$, one on each input connection 118 and 120, and determines a difference between the two input signals. The differential amplifier 112 amplifies this difference to produce an amplified signal. The amplified signal is provided on output connection 124. Because the amplifier 112 preferably is a fully differential amplifier, the amplifier 112 also provides an output signal on output connection 122. The difference between the potentials on connections 124 and 122 is approximately the difference between the inputs on connections 118 and 120 multiplied by the gain of the SAL 102. For example, if the difference between the inputs on connections 118 and 120 is 1V, and the gain of the SAL 102 is 2, the difference between the outputs on connections 124 and 122 will be 2V. The actual voltages output on connections 124 and 122 are determined by the output common mode voltage of the SAL 102, described further below.

The SAL 102 also comprises a feedback loop 128 which couples the output connection 124 to input connection 118 via impedance 136. Similarly, a feedback loop 126 couples the output connection 122 to input connection 120 via impedance 134. Impedances 130 and 132 are provided on input connections 118 and 120, respectively. The impedance values of impedances 130, 132, 134 and 136 may be chosen as desired. For example, the impedance values may be chosen so as to obtain a desired gain on the differential amplifier 112. Preferably, the gain of the amplifier 112 determines the gain of the amplifier 100. The connection 124 has a voltage OUTAP (relative to ground) and a current IAP flowing therethrough. The connection 122 has a voltage OUTAM (relative to ground) and a current IAM flowing therethrough. The differential amplifier 112 is powered by a power supply (not specifically shown) by applying a voltage across terminals 114 and 116. Although terminal 116 is shown as a ground, it may also be represented as a negative power supply.

As described above, the amplifier 112 determines the difference between input signals at the positive and negative input terminals and amplifies and outputs this difference. However, if the input voltages at the positive and negative terminals of the differential amplifier 112 are the same, and thus the differential amplifier 112 determines that the difference between the input voltages is zero, the differential amplifier 112 still provides output voltage signals OUTAP and OUTAM. These voltage signals will have a magnitude known as the output common mode voltage (hereinafter "common mode voltage") of the amplifier 112. The common mode voltage magnitude, in preferred embodiments, is half of the supply voltage. Thus, for example, if the voltage across terminals 114 and 116 is +4V, OUTAP may be +2V and OUTAM may be +2V. Similarly, if the voltage across terminals 114 and 116 is +10V, OUTAP may be +5V and OUTAM may be +5V.

The common mode voltage is almost always, if not always, present in OUTAP and OUTAM. In cases where there is a difference between the input voltages to the amplifier 112, the difference is amplified and is added to the common mode voltage to produce OUTAP and OUTAM. In cases where there is no difference between the input voltages to the amplifier 112, OUTAP and OUTAM comprise only the common mode voltage.

Still referring to FIG. 1, output connection 124 of the SAL 102 carries a current IAP (AC or DC, depending on whether the inputs are AC or DC) and a voltage OUTAP (relative to ground). Output connection 122 of the SAL 102 carries a current IAM (AC or DC, depending on whether the inputs are AC or DC) and a voltage OUTAM (relative to ground). The currents IAP and IAM are input to sensing logic 108 and 110, respectively. The sensing logic 108 comprises a current mirror 109 which detects the current IAP and outputs on connection 135 a current ISP which is proportional to the current IAP by a factor k. Stated otherwise, the current mirror 109 detects the current IAP and outputs a current ISP, where ISP=k(IAP). Similarly, the sensing logic 110 comprises a current mirror 111 which detects the current IAM and outputs on connection 133 a current ISM, where ISM=m(IAM). In preferred embodiments, factor k of the current mirror 109 is identical to factor m of the current mirror 111. In other embodiments, the factors k and m are different. The factors k and m may be selected as desired.

In addition to providing the current ISP on connection 135, the sensing logic 108 also enables current IAP to pass through to connection 150, as shown. Similarly, in addition to providing the current ISM on connection 133, the sensing logic 110 also enables current IAM to pass through to connection 152, also as shown.

The SAL 104 comprises a comparator logic (e.g., a latch comparator comprising a clock system) 138 and an amplifier 140 which couple together via a connection 139. The amplifier 140 may comprise any suitable single-input, single-output amplifier. The comparator logic 138 receives a CLK signal 137 (e.g., from a processor clock) and current ISP on connection 135. The comparator logic 138 uses the CLK signal 137 to modulate ISP. The comparator logic 138 may use any suitable modulation technique, including pulse density modulation (PDM), pulse width modulation (PWM), etc. The scope of this disclosure is not limited to any particular modulation technique. Regardless of the modulation technique that is used, the comparator logic 138 produces on output connection 139 a digitized version (e.g., a voltage pulse train) associated with the current ISP. The digital signal produced by the comparator logic 138 is amplified by amplifier 140 to produce an amplified, digital signal at connection 141. The amplified, digital signal is filtered by filter (e.g., a low-pass filter comprising an inductor and capacitor) 142 to integrate the digital signal into a sinusoidal current signal IDP at connection 143. In particular, because a pulsed waveform comprises a sinusoidal waveform with odd harmonics, the filter 142 removes the odd harmonics to produce the sinusoidal waveform. The voltage at connection 143, relative to ground, is OUTDP. The current IDP is provided to the load 154.

The SAL 106 has an architecture (and thus operates in a manner) similar to that of the SAL 104. More specifically, the SAL 106 comprises a comparator logic 144 and an amplifier 146 which couple together via a connection 145. The amplifier 146 comprises any suitable single-input, single-output amplifier. The comparator logic 144 receives the CLK signal 137 (e.g., from a processor clock) and the current ISM on connection 133. The comparator logic 144 uses the CLK signal 137 to modulate the current ISM. The comparator logic 144 may use any suitable modulation technique, including pulse density modulation (PDM), pulse width modulation (PWM), etc. The scope of this disclosure is not limited to any particular modulation technique. Regardless of the modulation technique that is used, the comparator logic 144 produces on output connection 145 a digitized version (e.g., a pulse train) of the current signal ISM. The digital signal produced by the comparator logic 144 is amplified by amplifier 146 to produce an amplified, digital signal at connection 147. The amplified, digital signal is filtered by filter (e.g., a low-pass filter comprising an inductor and capacitor) 148 to integrate the digital signal into a sinusoidal current signal IDM at connection 149. The voltage at connection 149, relative to ground, is OUTDM. The current IDM is provided to the load 154. Now that the architectures and operation of the SALs 102, 104 and 106 have been described, the overall operation of the amplifier 100 is described.

A first input voltage signal $V_{in}1$ is provided to input connection 118 and a second input voltage signal $V_{in}2$ is provided to input connection 120. The differential amplifier 112 determines the difference between $V_{in}1$ and $V_{in}2$. The differential amplifier 112 amplifies this difference in accordance with the gain associated with the amplifier 112 (i.e., as determined by the impedance values of the impedances 130, 132, 134 and 136). The differential amplifier 112 produces a signal at connection 124 and a signal at connection 122. The voltage at connection 124, relative to ground, is labeled OUTAP and the current passing through connection 124 is IAP. The voltage at connection 122, relative to ground, is labeled OUTAM and the current passing through connection 122 is IAM. The difference between OUTAP and OUTAM is approximately the difference between Vin1 and Vin2 multiplied by the gain of the SAL 102.

The currents IAP and IAM are provided to the sensing logic units 108 and 110, respectively. The current mirror 109 of the sensing logic 108 detects the amperage of the current IAP and produces a current ISP on connection 135 in proportion to a factor k. The current mirror 111 of the sensing logic 110 detects the amperage of the current IAM and produces a current ISM on connection 133 in proportion to a factor m. The currents IAP and IAM are provided to the load 154 via connections 150 and 152, respectively. The currents ISP and ISM are provided to SALs 104 and 106, respectively.

The comparator logic 138 of the SAL 104 modulates the current ISP to produce a digital signal at connection 139. The amplifier 140 amplifies the digital signal to produce an amplified digital signal, and the filter 142 removes odd harmonics associated with the amplified digital signal to produce a sinusoidal waveform. At connection 141, the voltage (relative to ground) is OUTDP and the current passing through the connection 143 is IDP.

The comparator logic 144 of the SAL 106 modulates the current ISM to produce a digital signal at connection 145. The amplifier 146 amplifies the digital signal to produce an amplified digital signal, and the filter 148 removes odd harmonics associated with the amplified digital signal to produce a sinusoidal waveform. At connection 147, the voltage (relative to ground) is OUTDM and the current passing through the connection 149 is IDM.

Figure 2:
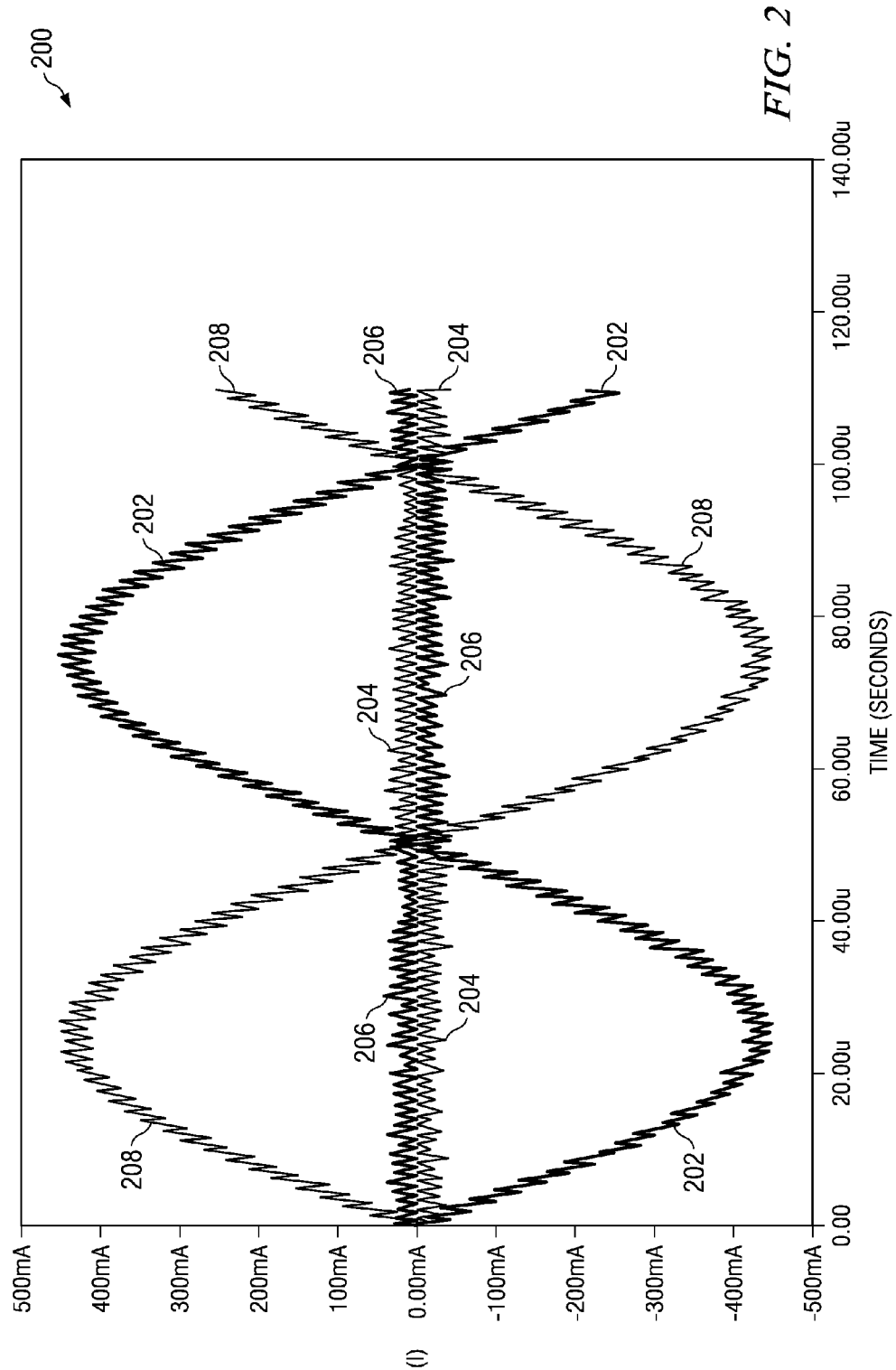
FIG. 2 shows a graph of electrical signals associated with the amplifier of FIG. 1, in accordance with embodiments of the invention.

The currents IDP, IAP, IAM and IDM combine at load 154 to produce a single current $i_{out}$ across the load 154. FIG. 2 shows a graph 200 showing illustrative currents IDP 202, IAP 204, IAM 206 and IDM 208. The x-axis of the graph 200 comprises time (in seconds) and the y-axis of the graph 200 comprises current (in milliamps). The currents IDP and IAP flow in a common direction, and the currents IAM and IDM flow in a common direction opposite to that of IDP and IAP. Accordingly, to determine the current $i_{out}$, the sum of currents IAM and IDM is subtracted from the sum of currents IDP and IAP to produce a single sinusoidal current waveform $i_{out}$ (not specifically shown). The voltage $v_{out}$ that is present across load 154 (due to $i_{out}$ flowing through load 154) is the differential, amplified version of the input signals provided to the SAL 102.

Figure 3:
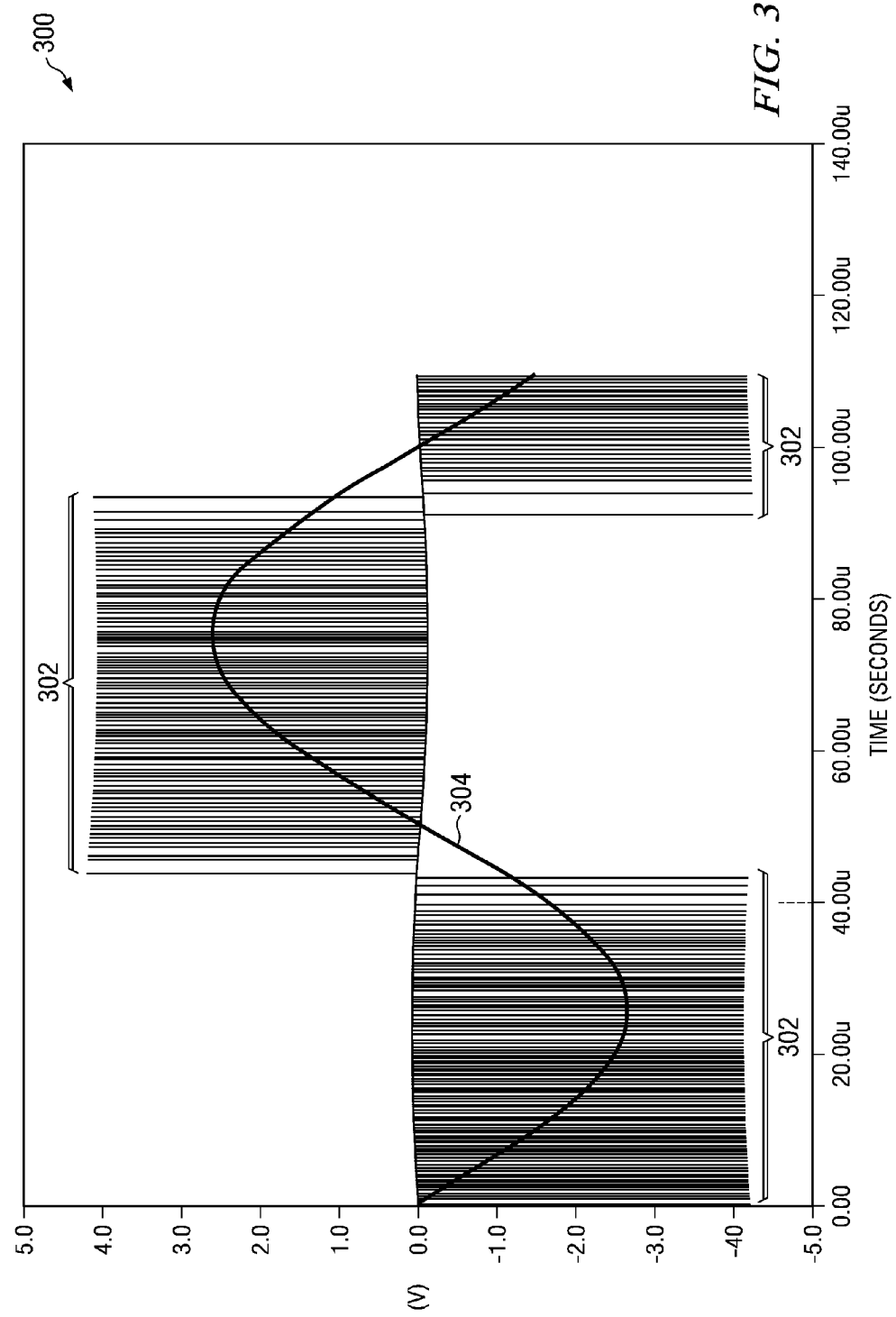
FIG. 3 shows another graph of electrical signals associated with the amplifier of FIG. 1, in accordance with embodiments of the invention.

FIG. 3 shows a graph 300 illustrating an exemplary voltage waveform 302 and another voltage waveform 304. The waveform 302 comprises the difference between the digital versions of voltages OUTDP and OUTDM (i.e., at connections 141 and 147). The waveform 304 comprises the difference between the sinusoidal versions of voltages OUTAP and OUTAM (i.e., at connections 143 and 149), also known as $v_{out}$ (across load 154). The waveform 304 is similar to the waveform 302 except that the waveform 304 has been processed by amplifiers 140, 146 and has been integrated by filters 142, 148. Some specific characteristics of the amplifier 100 are now presented.

The differential amplifier 100 preferably is capable of operating in both a "differential mode" and a "common mode." In some embodiments, the amplifier 100 is said to be in the differential mode when $v_{out}$ across the load 154 is either positive or negative. In some embodiments, the amplifier 100 is said to be in the differential mode when ISP and ISM have opposite signs (e.g., one current is below zero amperes and the other is above zero amperes). In some embodiments, the amplifier 100 is said to be in the common mode when $v_{out}$ across the load 154 is zero. In some embodiments, the amplifier 100 is said to be in the common mode when ISP and ISM have the same sign (e.g., both currents are above zero amperes or both currents are below zero amperes). The ability of the differential amplifier 100 to operate in the common mode (unlike other amplifiers, which generally operate only in the differential mode) enables the amplifier 100 to conserve power. In applications such as mobile devices (e.g., mobile communication devices like cell phones and personal digital assistants and mobile computer devices like laptop computers), which fall within the scope of this disclosure, the amplifier 100 can extend battery life.

Also in contrast to other amplifiers, the differential amplifier 100 preferably has a constant switching frequency. As used herein, the term "switching frequency" is defined as the frequency at which a digital pulse signal output by comparator 138 (or by comparator 144) switches from HIGH to LOW or LOW to HIGH when the difference between input signals applied at inputs 118 and 120 is zero. The amplifier 100 preferably has a constant switching frequency of approximately $$f_{CLK}/4,$$

where $f_{CLK}$=the frequency of the CLK signal 137. The constant switching frequency also may comprise a quantity determined by dividing $f_{CLK}$ by any suitable, desired number (e.g., even integers such as 2, 4, 6, 8, 10, etc.). An architecture that has a switching frequency which is solely dependent on the frequency of a CLK signal, as is the case with the architecture of the amplifier 100 described herein, has signal noise that is dependent only on the frequency of the CLK signal and is thus easier to control than in other architectures.

Figure 4:
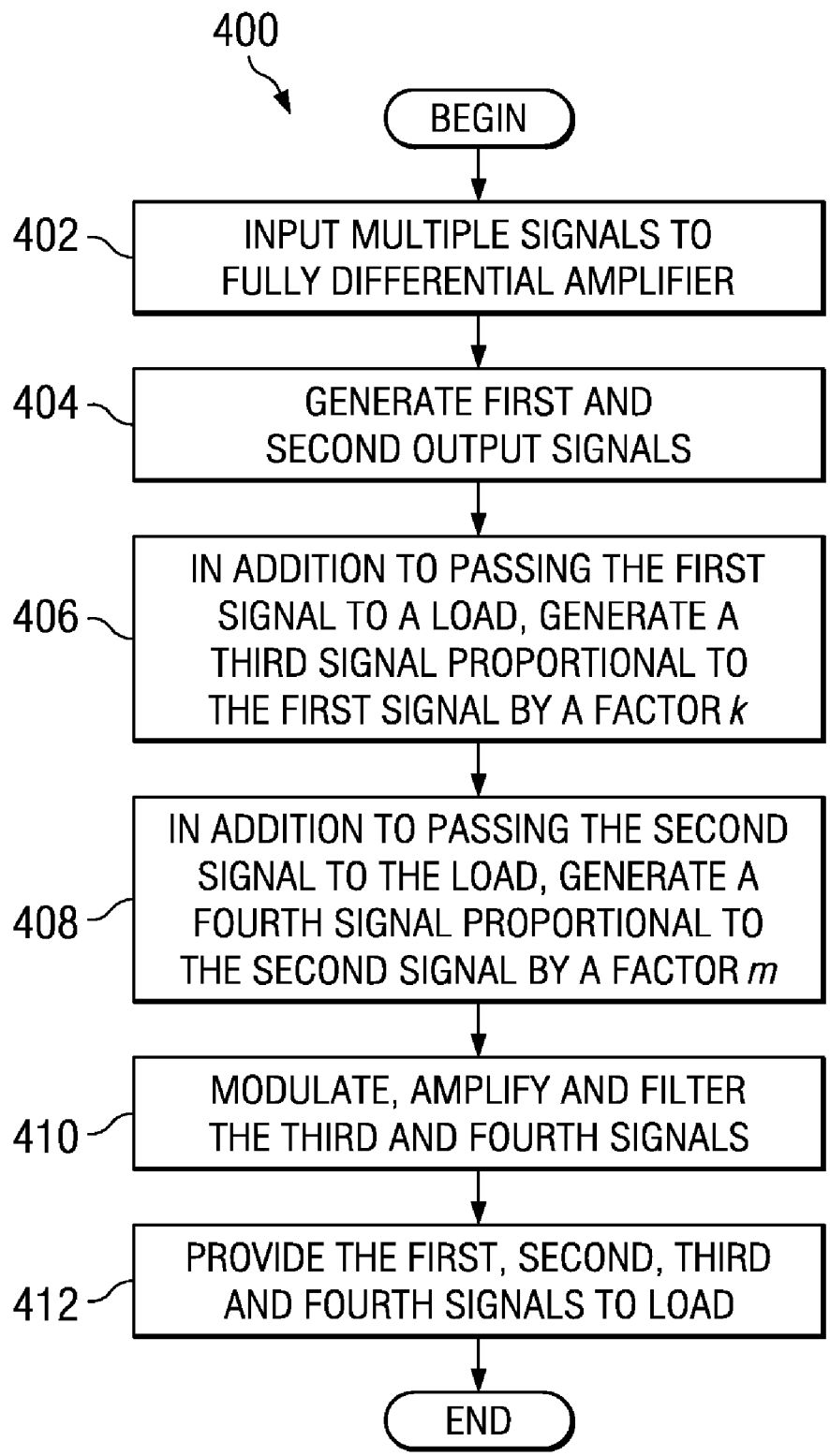
FIG. 4 shows a flow diagram of a method implemented in accordance with embodiments of the invention.

FIG. 4 shows a flow diagram of a method 400 in accordance with at least some preferred embodiments of the invention. The steps of method 400 may be performed in any suitable manner. The method 400 begins by providing multiple input signals to a fully differential amplifier (block 402), although a differential amplifier may be substituted with another suitable amplifier. The method 400 continues by generating first and second output signals from the differential amplifier (block 404). The method 400 continues by passing the first signal to a load and generating a third signal that is proportional to the first signal by a factor k (block 406). The method 400 also includes passing the second signal to the load and generating a fourth signal that is proportional to the second signal by a factor m (block 408). The factors k and m may be selected as desired and may be identical or different. The method 400 continues by modulating, amplifying and filtering the third and fourth signals (block 410). The method 400 includes providing the first, second, third and fourth signals to the load (block 412). The scope of this disclosure includes all suitable variations of the method 400, including variations in which steps of the method 400 are re-arranged, added or removed. The term "signals" may refer to currents, voltages or both.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An amplification device, comprising:
   an analog amplifier which outputs a first current and a second current;
   a first digital amplifier coupled to said analog amplifier, said first digital amplifier amplifies a modified version of said first current to produce a third current;
   a second digital amplifier coupled to said analog amplifier, said second digital amplifier amplifies a modified version of said second current to produce a fourth current;
   connections configured to provide the first, second, third and fourth currents through a load; and
   a current mirror that produces said modified version of said first current.

2. The amplification device of claim 1, wherein said amplification device comprises a differential architecture.

3. The amplification device of claim 1, wherein said modified version is equivalent to said first current multiplied by a factor.

4. The amplification device of claim 1, wherein said amplification device has a switching frequency which is constant when said first and second currents both are greater than zero amperes or both are less than zero amperes.

5. An amplification device, comprising:
   an analog amplifier which outputs a first current and a second current;
   a first digital amplifier coupled to said analog amplifier, said first digital amplifier amplifies a modified version of said first current to produce a third current;
   a second digital amplifier coupled to said analog amplifier, said second digital amplifier amplifies a modified version of said second current to produce a fourth current; and
   connections configured to provide the first, second, third and fourth currents through a load, wherein said amplification device has a switching frequency that is substantially equivalent to one-fourth of a frequency value of a clock signal provided to said first digital amplifier.

6. The amplification device of claim 5, wherein said switching frequency depends only on a frequency value of a clock signal provided to said first digital amplifier.

7. An amplification device, comprising:
   an analog amplifier which outputs a first current and a second current;
   a first digital amplifier coupled to said analog amplifier, said first digital amplifier amplifies a modified version of said first current to produce a third current;
   a second digital amplifier coupled to said analog amplifier, said second digital amplifier amplifies a modified version of said second current to produce a fourth current; and
   connections configured to provide the first, second, third and fourth currents through a load, wherein said amplification device has a switching frequency that is substantially equivalent to a fraction of a frequency value of a clock signal provided to said first digital amplifier, said fraction equivalent to 1/n, where n comprises an even integer.

8. The amplification device of claim 1, wherein said analog amplifier comprises a fully differential amplifier.

9. The amplification device of claim 1, wherein said first digital amplifier modulates the modified version of the first current using one of a pulse density modulation (PDM) technique or a pulse width modulation (PWM) technique.

10. The amplification device of claim 1, wherein, if the amplification device is in a common mode:
    the analog amplifier produces the first current on a first connection and the second current on a second connection;
    if a difference between input signals provided to the analog amplifier is zero, a difference between voltages on the first connection and the second connection is zero; and
    each of the voltages on the first connection and the second connection is substantially equivalent to half of a supply voltage provided to the analog amplifier to power the analog amplifier.

11. The amplification device of claim 1, wherein, if the amplification device is in a common mode, a voltage across the load is zero.

12. The amplification device of claim 1, wherein at least one of the first, second, third and fourth currents comprises a negative current.

13. A device, comprising:
    an analog amplifier that produces a first signal;
    a current mirror, coupled to the analog amplifier, which produces a second signal using the first signal, said second signal proportional to said first signal by a factor;
    a digital amplifier, coupled to the current mirror, which amplifies the second signal to produce a third signal; and
    a load through which the first and third signals pass;
    wherein a switching frequency of the device depends upon a frequency of a clock signal used by the digital amplifier to produce said third signal.

14. The device of claim 13, wherein said device comprises a differential, class AD amplifier.

15. The device of claim 13, wherein said clock signal is provided to a comparator logic associated with the digital amplifier, and wherein the comparator logic uses the clock signal to modulate said second signal to produce the third signal.

16. The device of claim 13, wherein the analog amplifier comprises a fully differential amplifier.

17. The device of claim 13, wherein the device comprises a second digital amplifier, coupled to the current mirror, which amplifies another signal from the analog amplifier to produce a fourth signal, and wherein the fourth signal also passes through said load.

18. The device of claim 13, wherein said switching frequency depends only upon said frequency of said clock signal.

19. The device of claim 13, wherein said switching frequency is approximately one fourth of said frequency of said clock signal.

20. The device of claim 13, wherein said switching frequency is approximately 1/n, where n comprises an even integer.

21. The device of claim 13, wherein said device comprises a mobile communication device.

22. A method, comprising:
using a differential amplifier to generate first and second signals;
generating a third signal proportional to the first signal by a factor;
generating a fourth signal proportional to the second signal by another factor;
using multiple digital amplifiers to amplify said third and fourth signals; and
providing the first signal, the second signal, said amplified third signal and said amplified fourth signal to a load wherein generating said third signal comprises using a current mirror, and wherein said current mirror does not include a sense resistor.

23. The method of claim 22, wherein a switching frequency associated with said differential amplifier and said digital amplifiers is dependent only upon a clock signal used by the digital amplifiers.

* * * * *